United States Patent [19]
Klostermark
[11] 4,207,544
[45] Jun. 10, 1980

[54] HIGH-FREQUENCY TRANSFORMER

[76] Inventor: Bernt Klostermark, Smedsbacksgatan 3B, 11539 Stockholm, Sweden

[21] Appl. No.: 884,172
[22] Filed: Mar. 7, 1978
[30] Foreign Application Priority Data
Mar. 25, 1977 [SE] Sweden ............ 7703466
[51] Int. Cl.[2] ............ H03N 5/00
[52] U.S. Cl. ............ 333/24 R; 333/119; 336/226
[58] Field of Search ............ 333/32, 33, 119, 24; 336/226

[56] References Cited

U.S. PATENT DOCUMENTS
1,691,125 11/1928 Polydoroff ............ 336/226

Primary Examiner—Alfred E. Smith
Assistant Examiner—Robert E. Wise
Attorney, Agent, or Firm—Le Blanc, Nolan, Shur & Nies

[57] ABSTRACT

A high frequency transformer for a wide range of frequencies and of the kind comprising a winding means attached on a core means, the winding means consisting of two parallel conductors isolated from each other, of which conductors one constitutes a primary winding, and the winding formed of the two conductors connected in series constitutes a secondary winding in a transformer coupled by economy coupling with a transforming ratio of 1:2. The conductors are wound on two parallel cores of soft magnetic materials spaced apart and connected by yokes at both ends. The winding pattern between cores lies in figure 8 patterns with opposite coils of the 8 patterns on each of the two cores.

12 Claims, 7 Drawing Figures

HIGH-FREQUENCY TRANSFORMER

This invention relates to a high-frequency transformer for a wide range of frequencies, where the ratio between the upper frequency limit and the lower frequency limit is at least 100:1 and preferably still higher, and where the upper frequency limit is of the magnitude 50 mega cycles per second (Mc/s).

It was found expedient to design such a transformer with a core of soft-magnetic material and the transformer in general in such a manner, that a solid coupling between the two windings is obtained, of which windings one is connected to a line with a low impedance and the second winding is connected to a line with a higher impedance. The object thereof is to obtain a transition from the line with the lower impedance to the line with the higher impedance—or vice versa—with lowest possible losses and with a stationary wave ratio as close to 1:1 as possible.

A very normal case is to obtain transition from a line with an impedance of 50 ohm to a line with an impedance of 200 ohm. This case presupposes a speed ratio in the transformer of 1:2 which can be obtained by winding the transformer with two parallel wires and making use of a so-called economizing coupling in the transformer, in such a manner that one winding alone forms the primary winding and the series connection of the two windings forms the secondary winding. At the economizing coupling usually used there is a galvanic connection between the primary and the secondary winding.

As already mentioned, a core of soft-magnetic material is used. In order to design the transformer with smallest possible external leakage fields, a closed core is wanted to be used, as is the case with normal power transformers. At high-frequency transformers intended to operate with very high frequencies, it is essential to design the core in a suitable way. It as found by experiments that better results are obtained when the core is designed tubular and on the tube of the soft-magnetic material an inner coat of conductive material, preferably copper, aluminium or brass, is applied.

The soft-magnetic material shall show low magnetic and dielectric losses within the frequency range used. As materials advantageously to be used in this connection were found soft-magnetic ferrite materials, which are commercially available under various names and of which Ferroxcube is a material, which is widely applied and exists in different forms with different values of permeability etc. For the purposes here concerned a material with permeability of the magnitude 500 was found advantageously useful.

According to the present invention, additional improved properties have been obtained by using a special design of the winding consisting of the two wires, in such a manner that one winding coil extends over two adjacent core sections and has the shape of an "8".

The characterizing features of the invention are apparent from the attached claims.

Figure 1:
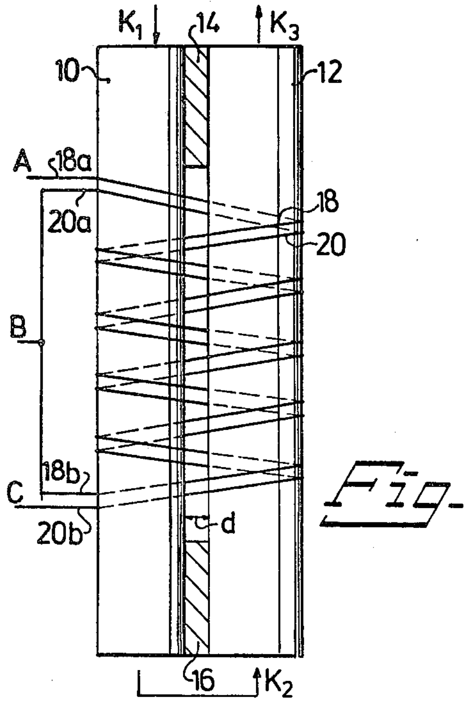
Figure 2:
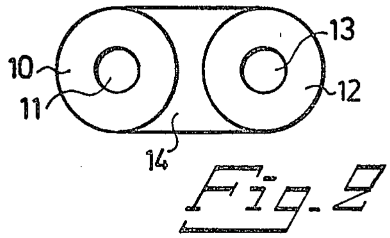
Figure 3:
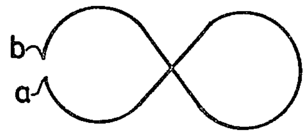
Figure 4:
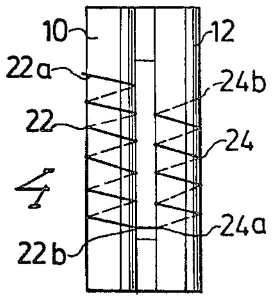
Figure 5:
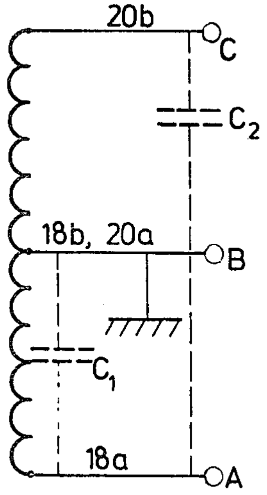
Figure 7:
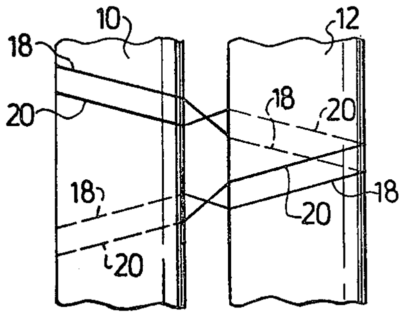
Figure 6:
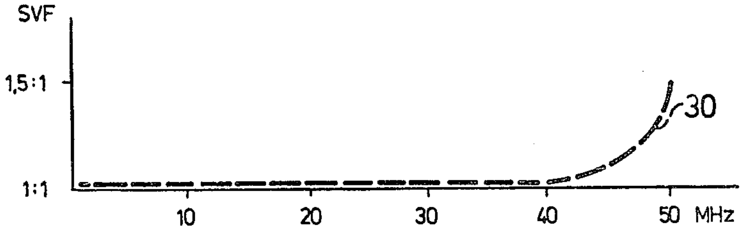

For a better understanding, the invention is described in greater detail in the following with reference to the accompanying drawings, in which FIG. 1 is a lateral view of a transformer according to the present invention, FIG. 2 is a view seen from above of the transformer shown in FIG. 1, FIG. 3 shows in a schematic manner a single winding coil in the transformer shown in FIG. 1, FIG. 4 shows the coupling of a transformer with a winding on each leg, FIG. 5 shows the coupling of a transformer of the kind here concerned, FIG. 6 shows a curve for the stationary wave ratio for a transformer designed according to the invention, FIG. 7 is a partial view showing a modified winding form.

The transformer shown in FIG. 1, which is a non-restrictory example of an embodiment of the invention, comprises a closed core in the form of two straight legs 10 and, respectively, 12, which substantially are in parallel with and connected to each other by means of yokes 14 and, respectively, 16 provided at both ends of the legs. At the embodiment shown, the legs 10 and 12 have a circular cross-section and are of tubular shape, so that in each leg 10 and 12 a passageway 11 and, respectively, 13 are formed which are coaxial with the circular core and on their inside are provided with a conductive metal coat of copper, aluminium, brass etc. Said metal coat may be formed as a tube for being used to pass a coolant through the respective leg.

The yokes 14 and, respectively, 16 consist of prisms with rectangular cross-section and terminating with end surfaces agreeing with the leg 10 and, respectively, 12, i.e. circular-cylindric legs of partially circular cylinder surfaces.

It is obvious that the structure shown, which has proved that the short yokes, in relation to the legs, must not be designed tubular (although such a design, of course, lies within the scope of the invention), brings about a closed core, which when being made of the aforesaid soft-magnetic ferrite material shows small external leakage fields and thereby meets one of the requirements mentioned above in the introductory portion for a high-frequency transformer of the kind here concerned.

One reason which particularly has contributed to the good results obtained by a transformer of the kind here referred to is, that the legs constituting the incomparably greater part of the path, along which the magnetic field in the transformer proceeds in accordance with what has been stated above, have been designed tubular with an inside metal coat. So far no theoretical explanation of this favourable result at a tubular core with a metal coat on its inside has come about, but experiments have proved the distinct improvement obtained over solid legs with the same dimensions. A possible reason may be the changes in the behaviour of the soft-magnetic ferrite material used, which occur at higher frequencies.

A substantial improvement, further, has been obtained by the winding being carried out with two parallel wires in the manner shown in FIG. 1, so that the two wires from the "front side" of the leg 10 pass over to the "rear side" of the leg 12 and thereafter pass over to the front side of the leg 12 and, intersecting the already wound portion, extend to the rear side of the leg 10 and further to the front side of the leg 10 and, intersecting already wound sections, pass to the rear side of the leg 12 and thereafter to the front side of said leg and further to the rear side of the leg 10, and so on. For a single winding coil a form thereof is obtained which is apparent from FIG. 3. The winding coil starts at "a", passes over the front side of the leg 12 and thereafter intersects to the rear side of the leg 12, continues to the front side of the leg 12 and extends via the rear side of the leg 10 to the end point "b" of the coil. It is, thus, obvious that the coil will have the shape of a lying "8" or of the sign of infinity.

When comparing the way of winding here shown with the usual way, as shown in FIG. 4, where in such a case a winding 22 would be on the leg 10, which winding extends along the length of the leg with a number of winding coils and thereafter continues with a number of winding coils located along the length of the leg 12 and forming a winding 24, the following becomes evident.

At the way of winding shown in FIG. 4, the voltage distribution along the two windings 22 and 24 is such that, with the starting point at the beginning 22*a* of the winding 22 a voltage will occur which increases with the distance from said beginning 22*a* to the end 22*b* of the winding 22. The voltage over the winding 24 starts with a voltage at the beginning 24*a* of the winding, which voltage is equal to the aforementioned voltage at the end 22*b* of the winding 22, whereafter the voltage increases to the end 24*b* of the winding 24. It is obvious that the sections of the winding 22 and 24 located most adjacent each other—i.e. in the intermediate space between the legs 10 and 12—will show voltage differences, which substantially are zero at the conjunction point between the end 22*b* and the beginning 24*a* and reach a maximum at the sections located near the beginning 22*a* and the end 24*b*. Thus, a varying but substantial capacitive coupling between different winding coils in the winding consisting of the two sections 22 and 24 is obtained.

It is easily understood that at the way of winding here referred to, with "eights", the situation is entirely different. Firstly, winding sections located directly in front of each other on the leg 10 and the leg 12 consist of directly series connected sections, and the voltage differences, therefore, are insignificant. Furthermore, the winding continues with its alternating sections on the legs 10 and 12 from one end of the transformer to the other end thereof, and the sections at 18*a* and 20*a* and at 18*b* and 20*b* showing the greatest voltage difference are located farthest away from each other. The leakage capacitances arising, therefore, have by no means the same detrimental nature as at a way of winding according to FIG. 4.

As already stated, the winding in FIG. 1 consists of two parallel wires 18 and 20, and such a way of winding offers a simple method of realizing a transition between two lines with impedances of the ratio 1:4 by using a transformer with economizing coupling, which coupling method is shown in FIG. 5. In FIG. 5, A designates the beginning 18*a* of the wire 18, B is the end 18*b* of the wire 18 coupled together with the beginning 20*a* of the wire 20, and C is the end 20*b* of the wire 20. A connecting of the transformer between a line with the impedance 50 ohm and a line with the impedance 200 ohm is carried out so that the line with 50 ohm is coupled to the connections A and B, and the line with the impedance 200 ohm is coupled to the connections A and C. For reasons of completeness it is pointed out that the line with the impedance 50 ohm also could be coupled to the connections B and C, and the line with 200 ohm as before could be coupled to the connections A and C. In the case when the line with the impedance 50 ohm is an unbalanced line (for example coaxial line), the wire with low potential of this unbalanced line is coupled to the connection B, which possibly may be earthed.

In the cases when the winding consisting of two wires is to be double tuned with respect to the two windings, capacitances can be added in the way shown in FIG. 5, one capacitance $C_1$ being connected over the wire 18 acting as primary winding as indicated by dashed lines between the connections A and B. In the same way a capacitance $C_2$ can be connected over the entire winding between the connections A and C acting as a secondary winding and consisting of the two coupled wires 18 and 20. The capacitance $C_1$ usually consists of a physical capacitor with a capacitance adjusted according to the conditions of up to, for example, 80 pF, and the capacitance $C_2$ in many cases can consist of the capacitances inherent in the winding proper, particularly when the line to be connected to the entire winding has an impedance exceeding 300 ohm.

For obtaining a transformer with a high upper frequency limit—50 mega cycles per second or thereabove—it was found advantageous to design the winding (18,20 in FIG. 1) consisting of two parallel wires in such a way, that it constitutes a transmission line with a characteristic impedance, which is adjusted to one line connected to the transformer. For this purpose, the two wires 18 and 20 (at the embodiment shown in FIG. 1) are to be wound on the respective leg 10 and 12 so that the wires 18 and 20 always are in parallel. For winding-technical reasons, the two wires always will lie in planes, which are in parallel with the legs 10 and 12. The distance between the wires 18 and 20 in one winding coil shall be shorter than the distance between the wires lying adjacent each other in a pair of winding coils lying immediately adjacent each other (i.e. the distance between the wire 20 in one coil and the wire 18 in the immediately subsequent coil). In general, for obtaining the desired impedance of the winding formed as transmission line, the distance between the wires 18 and 20 within the respective coil will be shorter than the wire diameter used and in many cases can be obtained by providing the wires with an isolation of a dielectricum with low dielectric losses. In the case of heavily loaded transformers it is suitable to make the wire isolation of polytetrafluoro ethylene (Teflon), which withstands high temperature.

By applying the aforesaid measures in combination, it is possible to obtain a high-frequency transformer, which has a stationary wave ratio near to 1:1 from low frequencies of the magnitude of a few kc/s up to 50 mega cycles per second. The length of the winding consisting of the wires 18 and 20 was dimensioned according to the formula $L=50/f$ where L is the length in meter of the winding and f is the upper limit frequency where the stationary wave ratio has increased to 1.5:1. By choosing the winding length in accordance with the value indicated by the formula, transformers with an upper frequency limit of, for example, 60–80 mega cycles per second could be produced which showed a high loading capacity at small volumes and a stationary wave ratio near to 1:1 substantially within the entire range.

As it was found that transformers according to the invention can be loaded very heavily, it is obvious that—in spite of good efficiency degree—substantial heat amounts arise due to the transformer losses. In order to prevent the transformer thereby to assume too high a temperature, the transformer must be cooled. It was found advantageous, as mentioned before, to design the legs 10 and 12 tubular and to apply on the inside of the tube a metal coat. It was found possible to design said metal coat as a metal tube—of copper, aluminum, brass or some other metal—and to pass a coolant therethrough. Although said coolant can be a gas, for example air, it was found much more efficient from a cooling aspect to use a liquid coolant, for example water or oil. At the transformer, for example shown in FIGS. 1 and 2, it is possible to feed the cooling water upwardly into the passageway 11 as indicated by the arrow $K_1$ and at the lower end of the transformer to connect the passageways 11 and 13 by a pipe in the manner indicated by the arrow $K_2$ and thereafter at the upper end of the transformer to lead off the cooling water from the passageway 13 as shown by the arrow $K_3$.

In the foregoing, the legs 10 and 12 were said to have circular cross-section. This, however, is not absolutely necessary. The legs can be given another suitable corss-section, for example that of a regular hexagon. Furthermore, when deemed suitable from a manufacturing point of view, the legs 10 and 12 and the yokes 14 and 16 may be designed of sections of soft-magnetic ferrite material which with a glue of suitable properties (good heat resistance and low dielectric losses) have been jointed to a suitable shape. The passageways 11 and 13 must not have circular cross-section, either, but in practice usually are given circular cross-section and then easier can be adjusted to the metal coats in the form of metal tubes, which must be provided.

In order to illustrate what can be achieved by applying the structural principles or teaching of the invention, an embodiment will be described. It agrees with the design shown in FIG. 1 and comprises two legs 10 and 12 with substantially circular cross-section and with an outer diameter of 30 mm and with passageways 11 and 13 having an inner diameter of 10 mm. In the passageways 11 and 13 a metal coat in the form of a brass tube with an outer diameter of 10 mm and an inner diameter of 7 mm is located, through which tubes cooling water is passed. The two legs 10 and 12 each have a total length of 200 mm, and the yokes 14 and 16 each have a length of 40 mm and a thickness of 30 mm. The distance between the axis lines of the legs 10 and 12 is 37 mm, and the minimum distance between the legs 10 and 12 (the distance d in FIG. 1), thus, is 7 mm. The winding consists of two parallel wires 18 and 20, each wire consisting of a copper wire with a diameter of 2 mm enclosed by a teflon-isolation in such a manner, that the wire has a diameter of 3.5 mm, measured on the isolation. The two wires 18 and 20 lies within the winding coils immediately adjacent each other, and the distance between the most closely adjacent wires of the winding coils (one wire 20 in a preceding coil and one wire 18 in the next subsequent coil) is about 12 mm. The number of winding coils amounted to ten. The primary winding consisting of the wire 18 had been given a capacitor with the capacitance 30 pF coupled as shown in FIG. 5, i.e. between the beginning **18*a* of the wire 18 and the end 18*b*** of the wire.

It was found at experiments that the afore-described transformer could be loaded with 5 kW. It further was found that the transformer showed a value for stationary wave ratio of practically 1:1 within a very wide range of frequencies, and that a value of 1.5:1 for the stationary wave ratio occurred first at about 50 mega cycles per second. In this respect, reference is made to the curve 30 in FIG. 6 where for drawing-technical reasons the curve 30 for the stationary wave ratio has been drawn somewhat above the horizontal axis indicating a value of 1:1 for the stationary wave ratio.

At the described transformer it was found possible by decreasing the number of winding coils to position the point where the value for the stationary wave ratio has risen to 1.5:1 to between 60 and 80 Mc/s.

The invention, of course, is not restricted to only the embodiment shown and described, but comprises all modifications falling within the scope of the attached claims. As an example of such a modification can be referred to the somewhat modified way of winding shown in FIG. 7, illustrating a section of the two legs 10 and 12 and a winding coil. It can be seen that on the leg 10 the conductor 18 passes uppermost and the conductor 20 below, but in the intermediate space between the legs 10 and 12 a reversal (transposition) takes place, in such a manner that the conductor 20 lies uppermost on the leg 12 and the conductor 18 lies beneath, whereafter at the next passage of the intermediate space between the legs 10 and 12 again a reversal takes place, so that again on the leg 10 the conductor 18 lies uppermost and the conductor 20 beneath. It is hereby possible to additionally obtain a balancing of the conditions for the two conductors 18 and 20.

What is claimed is:

1. A high-frequency transformer for a wide range of frequencies and of the kind comprising a winding means attached on a core means, the winding means consisting of two parallel conductors isolated from each other, of which conductors one constitutes a primary winding, and the winding formed of the two conductors connected in series constitutes a secondary winding in a transformer coupled by economy coupling with a transforming ratio of 1:2, characterized in that the two substantially parallel conductors (18,20) are wound on a core means of soft-magnetic material with low magnetic and dielectric losses in the alternating field and consisting of two substantially parallel oblong legs (10,12) disposed separated from each other and at both ends magnetically connected by yokes (14,16) to a substantially closed magnetic path, in such a manner, that starting from the adjacent leading points (**18*a*,20*a*) of the two conductors (18,20) the conductors are wound about a first leg (10) in a first winding direction to the intermediate space between said first leg (10) and said second leg (12), and thereafter the winding continues with one coil about said second leg (12) in a second opposed winding direction back to said intermediate space between the legs, and the winding continues with one coil about the first leg (10) in said first winding direction again to said intermediate space between the legs and passes over to a coil wound about said second leg (12) in said second winding direction, and so forth in the same manner, until the desired number of coils has been obtained, resulting in a winding with coils in the form of lying eights (infinity symbol) with one coil in such an eight on each of the legs (10,12), and the end (18*b*) of the first conductor (18) is coupled together with the leading end (20*a*) of the second conductor (20), and the first conductor (18) forms the primary winding of the transformer, and the two conductors (18,20**) coupled together in said manner form the secondary winding of the economy-coupled transformer.

2. A high-frequency transformer according to claim 1, characterized in that the transformer is designed double-tuned by capacitances formed over the primary and the secondary winding, in such a manner, that at least the capacitance lying over the primary winding (18) is a physical capacitor, while the capacitance over the secondary winding consists of the inherent capacitance of the winding.

3. A high-frequency transformer according to claim 1 or 2, characterized in that the winding means with the two parallel conductors is designed as a transmission line with a characteristic impedance obtained by the dimensioning of the conductors and the distance between the same, which impedance has a predetermined size for adjustment to a predetermined loading impedance.

4. A high-frequency transformer according to claim 3, characterized in that the length L of the transmission line is chosen substantially according to the formula L=50/f, where L is the length in meter and f is the upper frequency where the stationary wave ratio has been permitted to rise to about 1.5:1.

5. A high-frequency transformer according to claim 3, characterized in that the distance between the two conductors (18) relative to each other is shorter than the distance between adjacent conductors in two consecutive winding coils.

6. A high-frequency transformer according to claim 3, characterized in that the relative positive between the two conductors (18,20) has been reversed at the transition from one leg to the other one, in such a manner, that the conductor (18) lying uppermost on the first leg (18) after the transition to the second leg (12) via the intermediate space betwen the legs (10,12) is located on said second leg beneath the conductor (20), which on the first leg was lying beneath the first conductor (18).

7. A high-frequency transformer according to claim 3, characterized in that the two legs (10,12) have tubular shape, with a through passageway (11, 13) through each leg.

8. A high-frequency transformer according to claim 7, characterized in that the tubular leg is provided on its inside with a conductive coat, which preferably consists of copper, brass or aluminium and may be formed as a tube of said metal.

9. A high-frequency transformer according to claim 8, characterized in that means are provided to pass a coolant, which preferably consists of a liquid coolant, for example water, through said tube acting as coat.

10. A high-frequency transformer according to claim 7, characterized in that the legs (10,12) have a cross-section, which is circular or forms a substantially regular polygon.

11. A high-frequency transformer according to claim 7, characterized in that the yokes (14,16) have a sectional area, which at least is as great as the section area of the legs.

12. A high-frequency transformer according to claim 3, characterized in that the soft-magnetic material is a ferrite material with a permeability of the magnitude 500.

* * * * *